United States Patent
Tateyama et al.

(10) Patent No.: US 6,561,876 B1
(45) Date of Patent: May 13, 2003

(54) CMP METHOD AND SEMICONDUCTOR MANUFACTURING APPARATUS

(75) Inventors: Yoshikuni Tateyama, Hiratsuka; Tomoyuki Hirano, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/604,331

(22) Filed: Jun. 27, 2000

(30) Foreign Application Priority Data

Jun. 28, 1999 (JP) ............................................ 11-181545

(51) Int. Cl.[7] ................................................ B24B 7/22
(52) U.S. Cl. .......................................... 451/41; 451/57
(58) Field of Search ............................... 451/41, 36, 60, 451/288, 446, 57

(56) References Cited

U.S. PATENT DOCUMENTS 4,169,337 A  * 10/1979  Payne ......................... 451/41
6,059,920 A  *  5/2000  Nojo et al. ................... 156/345
6,083,840 A  *  7/2000  Mravic et al. ............... 438/693
6,221,118 B1 *  4/2001  Yoshida et al. ............... 51/309

FOREIGN PATENT DOCUMENTS

| JP | 8-22970 | 1/1996 |
| JP | 10-154672 | 6/1998 |
| JP | 11-033896 | 2/1999 |
| JP | 11-181403 | 7/1999 |

* cited by examiner

Primary Examiner—Robert A. Rose
(74) Attorney, Agent, or Firm—Finnegan, Henderson, Farabow, Garrett & Dunner, L.L.P.

(57) ABSTRACT

A CMP method for polishing and flattening a film having a rugged surface and formed on a surface of semiconductor substrate by making use of an abrasive cloth while feeding an abrasive agent to the film, wherein the abrasive agent comprises abrasive grains having a surface potential adjusted to negative, and a surfactant formed of a water soluble polymer. Cerium oxide or silicon oxide can be employed as the abrasive grain. As for the surfactant, it is possible to employ ammonium polyacrylate or an organic amine salt.

21 Claims, 4 Drawing Sheets

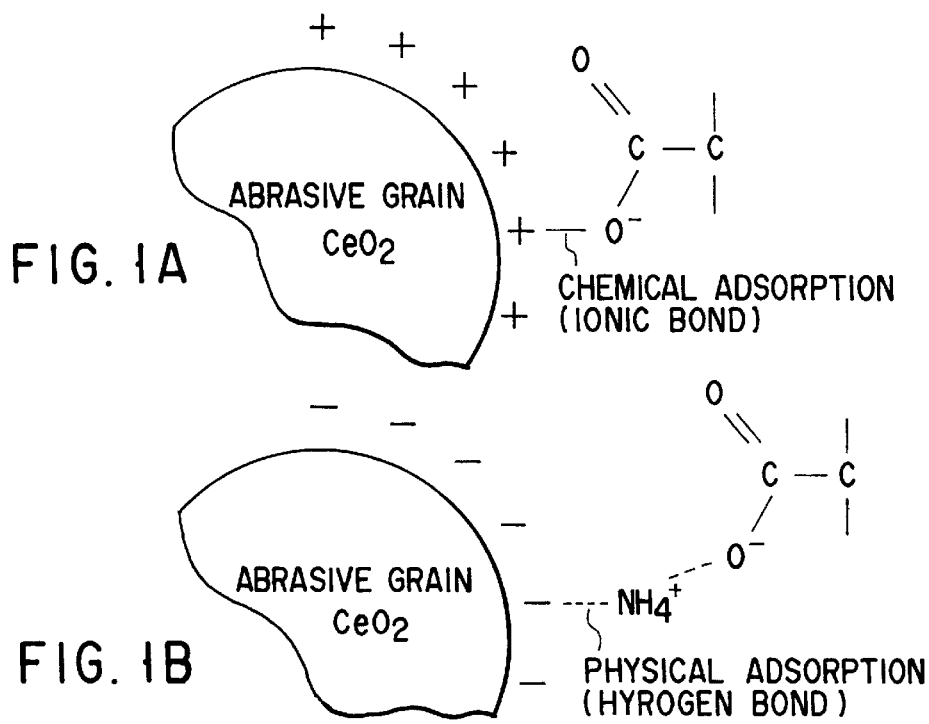
FIG. 1A
FIG. 1B
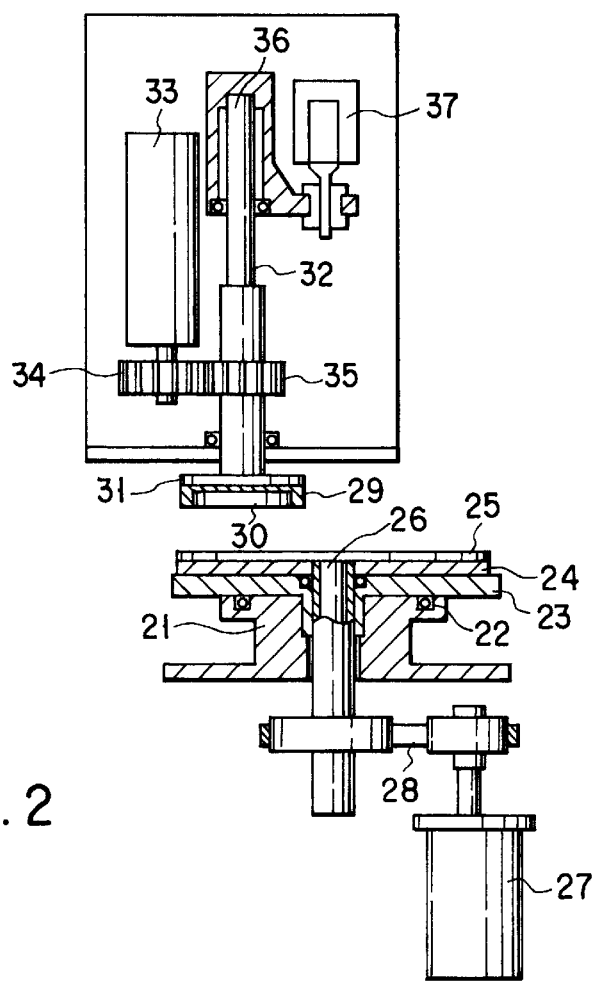
FIG. 2

CMP METHOD AND SEMICONDUCTOR MANUFACTURING APPARATUS

CROSS-REFERENCE TO RELATED APPLICATIONS

This application is based upon and claims the benefit of priority from the prior Japanese Patent Application No. 11-181545, filed Jun. 28, 1999, the entire contents of which are incorporated herein by reference.

BACKGROUND OF THE INVENTION

This invention relates to a CMP (Chemical Mechanical Polishing) method for flattening a film formed on a semiconductor substrate by polishing the film by means of the CMP, and in particular, to a novel abrasive grain to be included in an abrasive agent to be employed for the polishing.

In a wafer treatment process of a semiconductor device such as IC or LSI, the employment of an etch-back RIE (Reactive Ion Etching) has been known for flattening the surface of wafer, i.e. the process being performed in such a way that after a trench or contact hole of the wafer is filled with an optional material such as a metal, polycrystalline silicon, a silicon oxide ($SiO_2$) film, etc., the resultant surface is flattened by means of the RIE.

However, this etch-back RIE method is accompanied with various problems that it involves a step of coating an etch-back resist thus increasing the number of steps, that the surface of wafer is vulnerable to RIE damage, that it is difficult to achieve an excellent flattening, that it requires the employment of a vacuum system thereby complicating the structure of apparatus, and that it involves the employment of a dangerous etching gas.

Accordingly, as a flattening method of the surface of semiconductor substrate, a CMP method employing a polishing apparatus is increasingly employed recently, substituting for the conventional etch-back RIE method.

In recent years, for the purpose of further enhancing the integration and performance of a semiconductor device such as LSI, various fine processing techniques have been studied and developed. The aforementioned CMP method is one of the techniques which are now being developed for meeting such severe demands for increasingly finer working technique, and is a technique which is indispensable in the flattening of an interlayer insulating film or in the step of isolating buried elements.

One of important issues in this CMP method is how to prevent the dishing of a film to be polished. With a view to solve this problem, there has been proposed to incorporate a surfactant, which is an organic compound exhibiting a very strong interaction with the film, into an abrasive agent, thereby suppressing the dishing of the film. However, since the surfactant that has been added to an abrasive agent inevitably exerts a strong interaction also to the abrasive grain, the surface of the abrasive grain is covered with the organic compound, thereby raising the problem that the polishing speed will be prominently deteriorated.

The polishing apparatus generally comprises an abrasive disc provided on the surface thereof with an abrasive cloth and adapted to be rotated by means of motor, and an adsorption disc which is designed to rotatably support a substrate such as a semiconductor wafer and also designed to press the substrate being rotated onto the abrasive disc. The polishing of the substrate by making use of a polishing apparatus constructed as described above can be generally performed as follows. Namely, the surface to be polished (or polishing surface) of the substrate being rotated is pressed onto the abrasive cloth attached to the surface of abrasive disc being rotated, and under this condition, the polishing is continued while feeding an abrasive agent to the working portion of the abrasive cloth.

As for the abrasive grain to be included in the abrasive agent, it is possible to employ ceria (cerium oxide), silica (silicon oxide), silicon nitride ($Si_3N_4$), etc. After a CVD oxide film for instance is formed on the surface of semiconductor substrate so as to fill up or bury a recessed portion having a stopper film and formed in the surface of semiconductor substrate, the CVD oxide film is polished using the aforementioned polishing apparatus until the stopper film is exposed, thereby completely flattening the buried CVD oxide film.

The CMP treatment for polishing a film formed on a semiconductor substrate by making use of this polishing apparatus has been conventionally performed as follows. Namely, a treating film such as an oxide film formed on the surface of semiconductor substrate is polished until the film is thinned to a predetermined thickness, thereby completely flattening the film. After this polishing of the semiconductor substrate is finished, water is fed, substituting for the abrasive agent, to the surface of semiconductor substrate so as to perform a post-polishing of the semiconductor substrate, thereby finishing the entire process of the CMP treatment for flattening the surface of each semiconductor substrate.

The abrasive agent (or abrasive slurry) that has been conventionally employed is composed of an abrasive grain such as ceria (cerium oxide ($CeO_2$)) or silica ($SiO_2$) which is dispersed in a solvent such as pure water or ultra-pure water. As required, a surfactant comprising an organic compound is also added to this abrasive agent.

Even in this CMP method, there is a problem as mentioned above that due to a strong interaction to the abrasive grain of an organic compound that has been added as a surfactant to the abrasive agent, the surface of the abrasive grain is covered with the organic compound, thereby prominently deteriorating the polishing speed. Specifically, as shown in FIG. 1A, since the surface potential (or zeta potential) of the conventional abrasive grain ($CeO_2$) is positive, the organic compound added as a surfactant to the abrasive agent and having minus potential is caused to adhere all over the surface of the abrasive grain, thereby preventing the abrasive grain from functioning its inherent property.

By the way, the polarity of zeta potential (an electric potential formed traversing the interface between a solid and a liquid) existing on the surface of silicon semiconductor substrate or on the surface of abrasive grain that has been adhered to a treating film or a semiconductor substrate can be altered depending on pH. Specifically, as shown in the graph of FIG. 11 explaining the pH dependency of zeta potential, an abrasive agent comprising ceria grain as an abrasive grain would be negative in zeta potential if pH is not less than 7, but would be positive in zeta potential if pH is less than 7. Whereas, an abrasive agent comprising silica grain as an abrasive grain would be negative in zeta potential if pH is not less than 4.8, but would be positive in zeta potential if pH is less than 4.8.

In the operation of a polishing apparatus for performing the aforementioned CMP treatment, various kinds of abrasive agents are employed depending on the kinds of treating film formed on the surface of semiconductor substrate. Further, depending on the kinds of abrasive grain to be included in an abrasive agent, the zeta potential existing thereon would be varied. As explained above, the zeta potential is also dependent on pH.

BRIEF SUMMARY OF THE INVENTION

Therefore, an object of this invention is to provide a CMP method of a treating film (a film to be treated) formed on a semiconductor substrate, the method being featured in that the adsorption of a surfactant to an abrasive grain would become a weak physical adsorption, that the surfactant can be easily desorbed from the abrasive grain on the occasion of polishing, that the function of the abrasive grain can be sufficiently ensured thereby making it possible to achieve a higher polishing speed as compared with the conventional polishing, and that an excellent flattening performance can be achieved.

Another object of this invention is to provide an apparatus of manufacturing a semiconductor for executing the aforementioned method.

According to this invention, there is provided a CMP method for polishing and flattening a film (a film to be polished) having a rugged surface and formed on a surface of semiconductor substrate by making use of an abrasive cloth while feeding an abrasive agent to the film, wherein the abrasive agent comprises abrasive grains having a surface potential adjusted to negative, and a surfactant formed of a water soluble polymer.

Further, according to this invention, there is also provided a semiconductor manufacturing apparatus, which comprises an abrasive disc provided on the surface thereof with an abrasive cloth, an adsorption disc for securing a semiconductor substrate, a driving mechanism for rotating the abrasive disc and/or the adsorption disc, feeder for feeding an abrasive agent to the abrasive cloth, and mechanism for incorporating a surfactant comprising an anionic water soluble polymer into the abrasive agent to be fed to the abrasive cloth; wherein the abrasive agent incorporated with the surfactant contains an abrasive grain having a surface potential adjusted to negative.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A and 1B show respectively a diagram schematically illustrating an abrasive grain adsorbed with a surfactant according to the prior art and to this invention.

FIG. 2 illustrates a cross-sectional view of a polishing apparatus for carrying out the CMP method according to this invention;

DETAILED DESCRIPTION OF THE INVENTION

This invention is featured in that an abrasive agent containing an abrasive grain charged negatively is employed to perform a CMP treatment of a semiconductor substrate, and that a surfactant formed of an anionic water soluble polymer is incorporated into the abrasive agent.

Due to the employment of a negatively charged abrasive grain and the addition of a surfactant formed of an anionic water soluble polymer, the adsorption of the surfactant to the abrasive grain becomes a weak physical adsorption (a hydrogen bond), thereby enabling the surfactant to be easily desorbed from the abrasive grain on the occasion of polishing, so that the function of the abrasive grain can be sufficiently ensured thereby making it possible to achieve a higher polishing speed as compared with the conventional polishing, and at the same time, an excellent flattening performance can be achieved.

As shown in FIG. 1A, since the surface potential (or zeta potential) of the conventional abrasive grain ($CeO_2$) is positive, an anionic surfactant incorporated into the abrasive agent is caused to adhere through an ionic bond to the entire surface of the abrasive grain, thereby preventing the abrasive grain from working and hence, making the abrasive grain impossible to function its inherent property.

Whereas, as shown in FIG. 1B, the abrasive agent ($CeO_2$) of this invention where the surface potential (zeta potential) thereof is kept negative is adsorbed, through hydrogen bond, with a surfactant. Since this adsorption is a physical adsorption, the bonding force thereof is smaller than a chemical bond.

Next, the mechanism of CMP treatment using this abrasive agent as it is performed by making use of the CMP apparatus shown in FIG. 2 will be explained.

Figure 3:
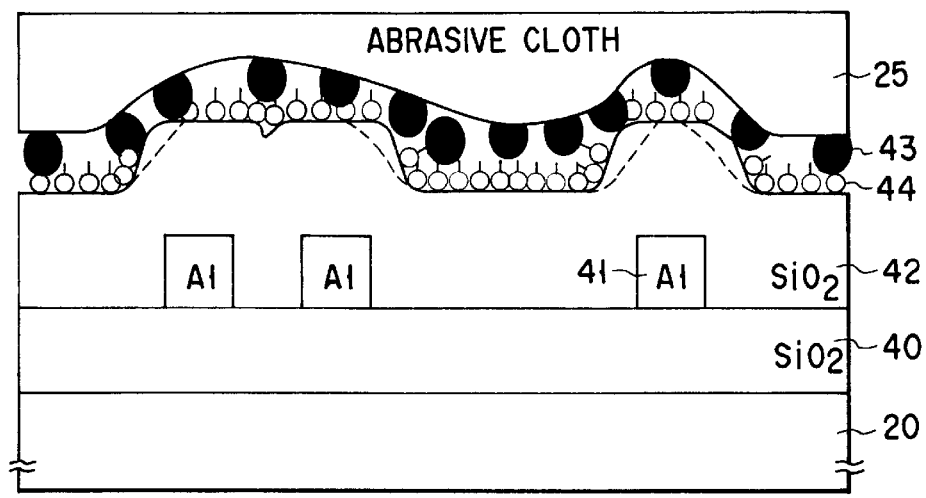
FIG. 3 is a cross-sectional view illustrating a state wherein the abrasive cloth (abrasive pad) of the polishing apparatus is pressed onto the surface of a semiconductor substrate.

FIG. 3 is a cross-sectional view illustrating a state wherein the abrasive cloth (or abrasive pad) of the polishing apparatus is pressed onto the surface of a semiconductor substrate. As seen from FIG. 3, an interlayer insulating film 40 consisting of a silicon oxide film ($SiO_2$) which may be formed by means of CVD (Chemical Vapour Deposition) for instance is formed on the surface of a silicon semiconductor substrate 20. On this flattened surface of the interlayer insulating film 40, formed is a metallic wiring pattern 41 made of aluminum for instance. An additional interlayer insulating film 42 consisting of a silicon oxide film ($SiO_2$) which may be formed by means of CVD for instance is formed so as to cover the metallic wiring pattern 41.

Since this interlayer insulating film 42 is formed to cover the metallic wiring pattern 41, the resultant surface thereof is not a flat surface. Therefore, if it is desired to form an additional wiring pattern on this rugged surface, a flattening treatment of this rugged surface is required to be performed. For this flattening, this rugged surface is then polished by making use of a polishing cloth 25 of the polishing apparatus shown in FIG. 2.

The abrasive agent to be employed in this case contains ceria (cerium oxide) grains functioning as an abrasive grain, which are dispersed in a solvent such as pure water or ultrapure water. In order to uniformly disperse the abrasive grain, an anionic polymer surfactant is added to the abrasive agent. As this surfactant is added to the abrasive agent, each abrasive grain is caused to be surrounded by the surfactant. Even if the abrasive grain is surrounded by the surfactant in this case, the surfacant and the abrasive grain are bonded simply through a physical adsorption, since the surface potential (zeta potential) of the abrasive grain is negative.

Therefore, the bonding force thereof is smaller than a chemical bond between the conventional abrasive grain and the surfactant. Accordingly, when the surface of the interlayer insulating film 42 is polished using the abrasive cloth 25 with an abrasive agent containing the abrasive grain 43 and a surfactant 44 being interposed therebetween, the recessed portions in the surface of the interlayer insulating film 42 will be filled with the surfactant 44, so that there is little possibility that the abrasive grain 43 is contacted with the surface of the interlayer insulating film 42.

On the other hand, at the edge portions of the projected portions of the interlayer insulating film 42 which cover the wiring pattern 41 however, the surfactant 44 is kept away from the edge portions by the effect of small pushing force of the abrasive cloth 25, so that the abrasive grain 43 is allowed to be directly contacted with these edge portions, thereby enabling the polishing to be effected first of all from these edge portions.

As a result, since these edge portions can be selectively polished at first, the flattening of the surface of the interlayer insulating film 42 can be effectively proceeded. When the flattening is proceeded to some extent, the surfactant 44 is allowed to interpose throughout the interface between the abrasive grain 43 and the surface of interlayer insulating film 42, thereby permitting the polishing to proceed in a uniformly retarded manner, thus finishing the polishing treatment.

The CMP method according to this invention comprises a step of polishing and flattening a treating film having a rugged surface and formed on a surface of semiconductor substrate by making use of the abrasive cloth of abrasive disc while feeding an abrasive agent to a semiconductor substrate, and is characterized in that the abrasive agent is constituted by an abrasive grain having a surface potential adjusted to negative, and that a surfactant formed of a water soluble polymer is added to the abrasive agent.

The surfactant may be incorporated into the abrasive agent as the abrasive agent is fed to the surface of semiconductor substrate. As for the abrasive grain, it is possible to employ cerium oxide, silicon oxide, or silicon nitride. When the abrasive grain is formed of cerium oxide grain, the pH of the abrasive agent containing this abrasive grain should preferably be adjusted to not less than 7. On the other hand, when the abrasive grain is formed of silicon oxide grain, the pH of the abrasive agent containing this abrasive grain should preferably be adjusted to not less than 5.

The adjustment of pH of the abrasive agent can be performed by adding an alkali such as ammonium hydroxide and potassium hydroxide to the abrasive agent.

As for the surfactant consisting of a water soluble polymer that can be employed in this invention, it is possible to employ a water-soluble polymer having a carboxyl group or sulfo group. Among them, an anionic polymer surfactant such as ammonium polyacrylate, or an organic amine can be preferably employed.

The molecular weight of the water soluble polymer constituting the surfactant should preferably be in the range of 100 to 10,000. The content of the surfactant should preferably be in the range of 0.3 to 5.0% by weight based on the weight of the abrasive agent.

The semiconductor manufacturing apparatus according to this invention comprises an abrasive disc provided on the surface thereof with an abrasive cloth; an adsorption disc for securing a semiconductor substrate; a driving means for rotating the abrasive disc and/or the adsorption disc; means for feeding an abrasive agent to the abrasive cloth; and means for incorporating a surfactant comprising an anionic water soluble polymer into the abrasive agent to be fed to the abrasive cloth; wherein the abrasive grain included in the abrasive agent on the occasion of polishing has a surface potential adjusted to negative.

Various embodiments of this invention will be explained with reference to drawings.

First of all, the polishing apparatus for carrying out the CMP treatment according to this invention will be explained with reference to FIG. 2. Namely, FIG. 2 shows a cross-sectional view of the polishing apparatus. Referring to FIG. 2, an abrasive disc receiver 23 is disposed via a bearing 22 on a stage 21. On this abrasive disc receiver 23 is mounted an abrasive disc 24. A polishing cloth 25 for polishing a wafer (a semiconductor substrate) is adhered to the surface of this abrasive disc 24.

For the purpose of rotating the abrasive disc receiver 23 and the abrasive disc 24, a driving shaft 26 is attached to the axial portions of these members 23 and 24. This driving shaft 26 is adapted to be rotated via a rotating belt 28 by a motor 27. On the other hand, the wafer 20 is positioned so as to face the abrasive cloth 25 and fixed by advantage of vacuum or water to an adsorption cloth 30 and a template 29 which are attached to an adsorption disc 31.

This adsorption disc 31 is connected with a driving shaft 32, which is designed to be rotated via gears 34 and 35 by a motor 33. This driving shaft 32 is fixed to a driving table 36 which is attached to a cylinder 37 so as to enable the driving table 36 to move up and down as the cylinder 37 is moved up and down. As a result, an abrasive agent is allowed to be fed to an interface between the wafer 20 fixed to the adsorption disc 31 and the abrasive cloth 25, thus making it possible to perform the polishing of the wafer 20.

According to this polishing apparatus, as the cylinder 37 is moved up and down, the driving table 36 is caused to move up and down, thereby enabling to feed a desired kind of abrasive agent that has been selected in conformity with the feature of film to be polished to an interface between the wafer 20 fixed to the adsorption disc 31 and the abrasive cloth 25, thus making it possible to supply the abrasive agent to the working portion of the abrasive cloth 25. This polishing can be performed while pressing the wafer 20 onto the surface of the abrasive disc 24 being rotated at a speed of 100 rpm. The rotational speed of the abrasive disc 24 may be in the range of 20 to 200 rpm, while the pressing force in this case may be in the range of 50 to 500 g/cm².

Figure 4:
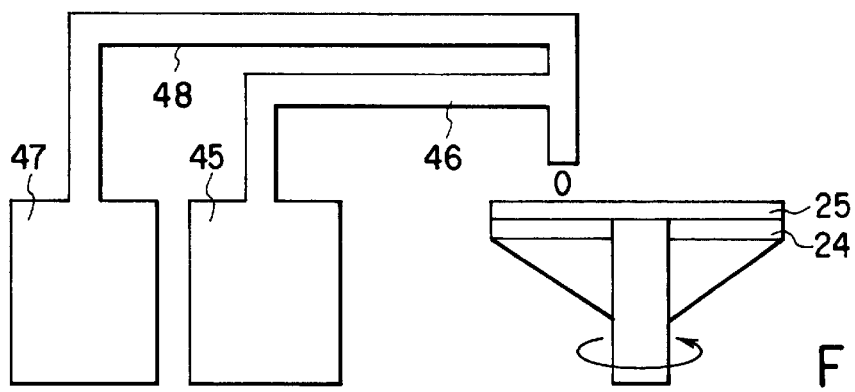
FIG. 4 is a partial cross-sectional view of a polishing apparat for carrying out the CMP method according to this invention.

FIG. 4 shows an enlarged partial cross-sectional view illustrating the abrasive agent-feeding means of the polishing apparatus of FIG. 2. In this embodiment, the abrasive agent is added to the surfactant immediately before the abrasive agent is fed to the working portion of the abrasive cloth 25.

Referring to FIG. 4, as the means to feed the abrasive agent to the vicinity of the working portion of the abrasive cloth 25 supported by the rotating abrasive disc 24, an abrasive agent-feeding nozzle is disposed, this nozzle being connected via a pipe 48 with an abrasive agent tank 47. Further, as the means to feed the surfactant to the abrasive agent, a pipe 46 connected with a surfactant tank 45 is disposed over the abrasive cloth 25. This pipe 46 is also connected with the abrasive agent-feeding nozzle disposed above the abrasive cloth 25.

In this construction, since the surfactant is added to the abrasive agent immediately before the employment of the abrasive agent, the denaturing of the abrasive agent or the change of pH can be prevented. Further, the surfactant is added to the abrasive agent after the surfactant is formulated into a solution (the content of the surfactant is 30 wt % for instance) by dissolving it in a solvent such as water. In this case, the content of the surfactant in the abrasive agent at the moment of feeding the abrasive agent to the abrasive cloth 25 may be in the range of 0.3 to 5.0 wt %, more preferably in the range of 0.5 to 1.5 wt %. The feeding rate of the abrasive agent from the pipe 48 is 200 mL/min. for instance, and the feeding rate of the surfactant from the pipe 46 is 6.2 mL/min. for instance.

In this embodiment, the abrasive agent contained ceria grain as an abrasive grain. However, according to this invention, any kind of abrasive grain can be employed as long as it has a negative surface potential. Accordingly, other than ceria grain, it is also possible to employ silica (silicon oxide) grain for instance.

The abrasive grain employed herein had an average particle diameter of 0.2 $\mu$m, and the pH of the abrasive agent containing this abrasive grain was 8.5. The content of the abrasive grain in the abrasive agent was 0.5 wt %. On the other hand, in the conventional CMP treatment, the abrasive grain (ceria grain) of the abrasive agent employed was 0.2 $\mu$m in average particle diameter, the pH of the abrasive agent containing this abrasive grain was 5.5 and the content of the abrasive grain in the abrasive agent was 3.0 wt %.

Figure 11:
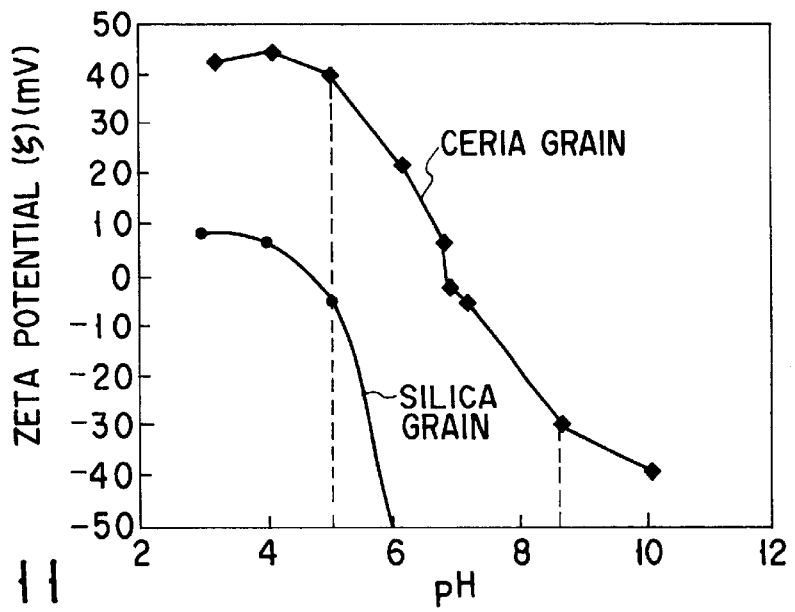
FIG. 11 is a graph for explaining the pH dependency of the surface potential (zeta potential) of abrasive grain.

As shown in FIG. 11, the surface potential (zeta potential) of abrasive grain changes depending on the pH of the abrasive agent. The ordinate in FIG. 11 represents the zeta potential of abrasive grain (ceria), while the abscissa represents the pH of the abrasive agent. As seen from FIG. 11, when the pH of the abrasive agent exceeds over 7, the surface potential of ceria becomes negative, so that it can be employed as an abrasive grain in this invention. On the other hand, in the case of silica grain, when the pH of the abrasive agent exceeds over 4.8, the surface potential thereof becomes negative, so that, under such a pH range, it can be employed as an abrasive grain in this invention.

The content of ceria grain in the abrasive agent according to this invention should preferably be in the range of 0.1 to 3 wt % in view of ensuring a stable polishing.

As for the anionic polymer surfactant that can be employed in this embodiment, it is possible to employ ammonium polyacrylate which can be obtained by partially or completely neutralizing polyacrylic acid with ammonium. The polyacrylic acid to be employed in this case can be represented by the following formula (A).

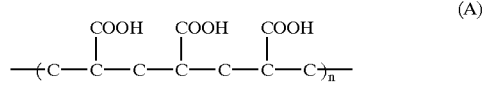

(A)

When ammonia (NH₃) is added to this polyacrylic acid (A) to thereby completely neutralize the acid, an ammonium salt represented by the following formula (B) can be obtained.

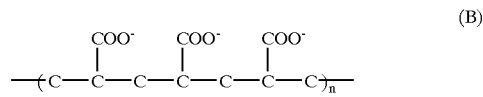

(B)

This ammonium salt (B) is completely neutralized (the degree of neutralization=1.0). However, an ammonium salt 0.33 in the degree of neutralization which can be represented by following formula (B') can be also employed as a surfactant in this invention.

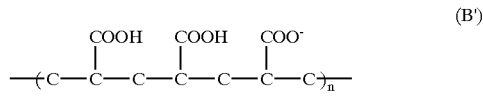

(B')

These surfactants are formed of the aforementioned anionic polymer compounds and can be employed in a state of solution by dissolving them in a solvent such as pure water or ultra-pure water. In this embodiment, the molecular weight of the ammonium polyacrylate was 3,000 and the content in the solution thereof was 30 wt %. The pH of the surfactant was 5.5 to 6.0.

The abrasive agent to be employed in the CMP treatment according to this invention is, as described above, composed of an abrasive grain having a negative surface potential, a surfactant consisting an anionic polymer, and a solvent. In this case, the abrasive grain functions to improve the polishing rate, while the surfactant functions to reduce the magnitude of dishing.

Next, the changes in property of a surfactant depending on the degree of neutralization of a polymer compound (ammonium polyacrylate) will be explained with reference to FIG. 5. The ordinate in FIG. 5 represents the magnitude of dishing (nm) which was caused to be formed when an insulating film (SiO₂) covering a plurality of wiring line having a space of 300 $\mu$m and formed on a semiconductor substrate was polished, while the abscissa represents the polishing rate (nm/min) of the insulating film after the surface of the substrate was flattened.

Figure 5:
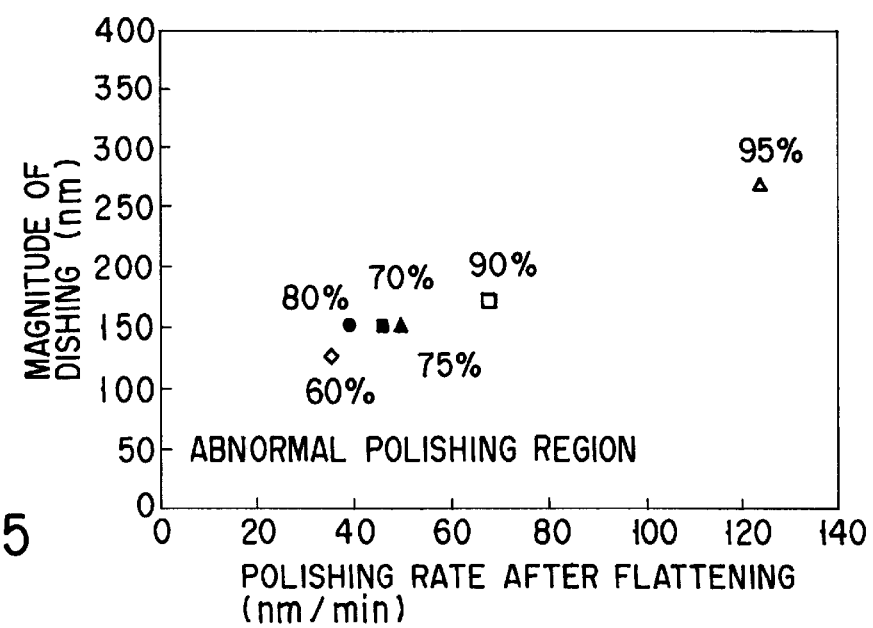
FIG. 5 is a graph illustrating changes in property of a surfactant depending on the degree of neutralization of a polymer compound (ammonium polyacrylate)

As seen from FIG. 5, it was possible, according to the abrasive agent to be employed in the method of this invention, to reduce the magnitude of dishing irrespective of the value of the degree of neutralization as compared with where an abrasive agent containing the conventional abrasive grain having a positive surface potential (zeta potential) was employed. However, if the degree of neutralization is too excessive, the polishing rate cannot be reduced even if the insulating film is flattened by the CMP treatment, thereby allowing the polishing to further proceed. On the other hand, if the degree of neutralization is too low, it may fall into an abnormal polishing region, thus making it impossible to perform the normal polishing of the insulating film. In view of these facts, the degree of neutralization should preferably be in the range of 0.6 to 0.94.

This degree of neutralization will be also influenced by an alkaline metal ion such as Na and K which may be included as impurities in the compound. Therefore, the total quantity of alkaline metals such as Na, K, etc. in the compound should preferably be limited to 30 ppm or less, more preferably 10 ppm or less.

Next, the effects of the CMP treatment according to this invention will be explained with reference to FIGS. 6 and 7.

Figure 6:
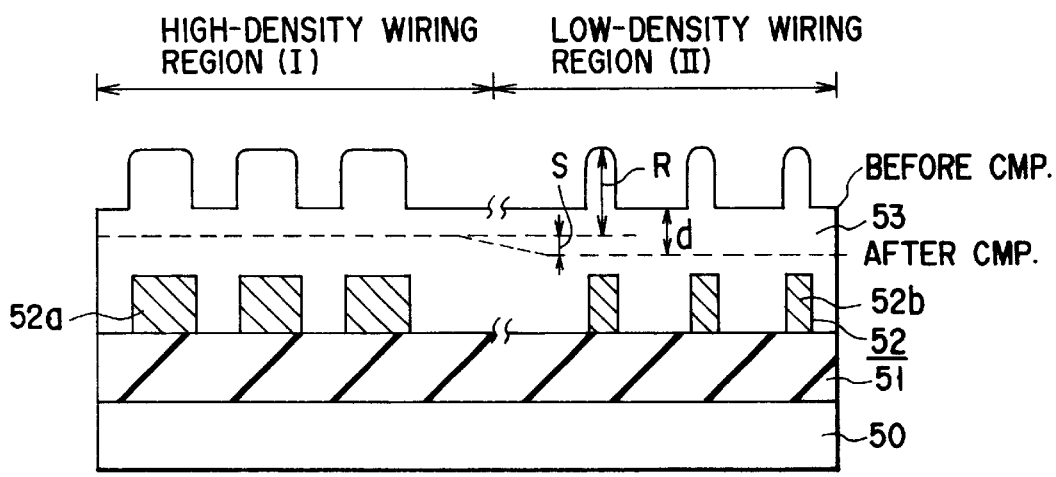
FIG. 6 is a cross-sectional view of a semiconductor substrate illustrating the method of polishing an insulating film covering a wiring pattern.

FIG. 6 is a cross-sectional view of a semiconductor substrate having a wiring pattern formed thereon, illustrating the state of insulating film after the polishing thereof by means of the CMP treatment. On the other hand, FIG. 7 shows a graph for explaining a difference in effect between an abrasive agent employed in the method of this invention and an abrasive agent containing an abrasive grain of the prior art.

Figure 7:
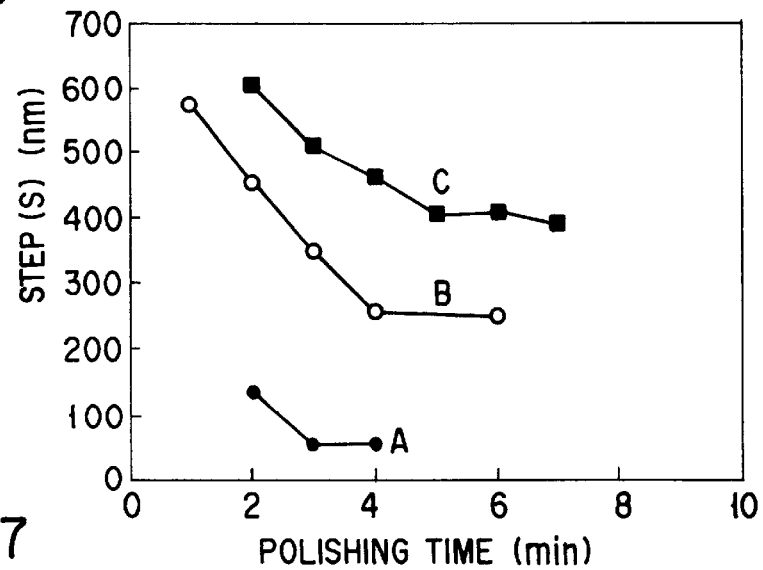
FIG. 7 is a graph for explaining a difference in effect between an abrasive agent to be employed in the method of this invention and an abrasive agent using an abrasive grain of the prior art.

The ordinate in FIG. 7 represents the magnitude of step (nm) representing a difference between the thickness of a high-density wiring region and the thickness of a low-density wiring region after the polishing, while the abscissa represents the polishing time (min).

Referring to FIG. 6, a first insulating film 51 composed of a silicon oxide film ($SiO_2$) for instance is formed on the surface of a semiconductor substrate 50 constituted by silicon for instance. Additionally, a wiring pattern 52 made of aluminum is formed on the flattened surface of this insulating film. In the high-density wiring region (I) of the semiconductor substrate, there is formed a high-density wiring pattern 52a having a line width of 300 μm and an interwiring interval of 30 μm (L/S=300/30 μm). On the other hand, in the low-density wiring region (II) thereof, there is formed a low-density wiring pattern 52b having an L/S ratio of 30/300 μm. Additionally, a second insulating film 53 composed of a silicon oxide film ($SiO_2$) for instance is formed on the surface of the first insulating film 51 in such a manner as to cover the wiring pattern 52.

The CMP treatment according to this invention is executed against to this second insulating film 53.

Namely, when this second insulating film 53 is subjected to polishing by means of the CMP treatment, the rugged surface thereof which was as prominent as shown by the solid line in FIG. 6 before the CMP treatment can be flattened as shown by a dot line after the CMP treatment. In this case, since the polishing rate is more prominent in the low-density wiring region (II) where the wiring pattern is relatively scarce than in the high-density wiring region (I), a step (S) is caused to generate between both regions.

However, since the polishing rate can be increased by the employment of the abrasive agent of this invention, the CMP treatment can be finished within a short period of time, thus making it possible to effectively perform the polishing treatment of the projected portion, and hence, the throughput of flattening treatment can be improved.

The line A in FIG. 7 represents a polishing property obtained in the CMP treatment which was performed using the abrasive agent of this invention, the line B represents a polishing property obtained in the CMP treatment which was performed using the abrasive agent of the prior art containing an abrasive grain (ceria grain) having a positive surface potential, and the line C represents a polishing property obtained in the CMP treatment which was performed using the abrasive agent of the prior art containing an abrasive grain (silica grain) having a positive surface potential.

It will be seen from FIG. 7 that according to the CMP treatment of this invention, the polishing time can be shortened, and at the same time, the step S to be generated between the low-density wiring region and the high-density wiring region can be remarkably reduced as compared with the methods of the prior art, thereby making it possible to ensure a sufficient flatness of the film.

Next, the effect of minimizing the magnitude of dishing that can be realized by the CMP treatment of this invention will be explained with reference to FIG. 8.

Figure 8:
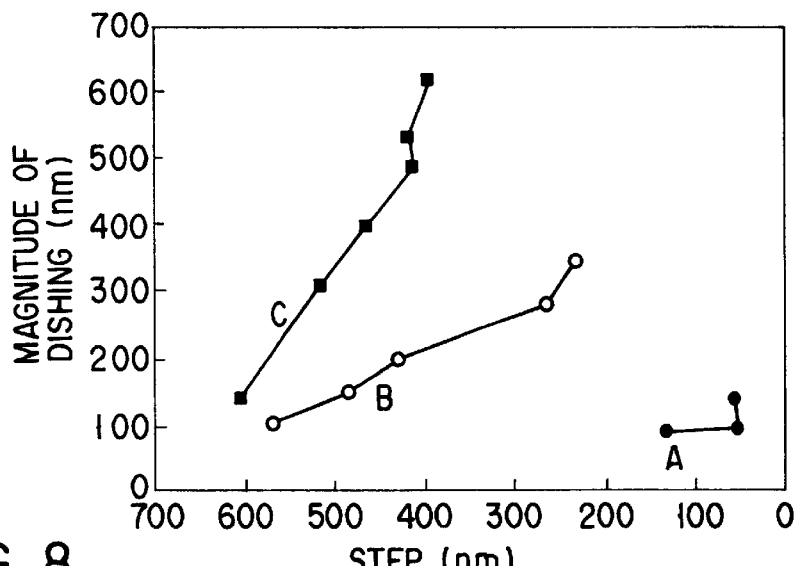
FIG. 8 is a graph for explaining a difference in effect between an abrasive agent to be employed in the method of this invention and an abrasive agent using an abrasive grain of the prior art.

FIG. 8 is a graph for explaining a difference in effect to be derived between an abrasive agent to be employed in the method of this invention and an abrasive agent using an abrasive grain of the prior art. The ordinate in FIG. 8 represents the magnitude of dishing (D) (nm) of the insulating film 53 shown in FIG. 6, while the abscissa represents the step (S) representing a difference between the thickness of a high-density wiring region and the thickness of a low-density wiring region after the polishing.

The line A in FIG. 8 represents a polishing property obtained in the CMP treatment which was performed using the abrasive agent of this invention, the line B represents a polishing property obtained in the CMP treatment which was performed using the abrasive agent of the prior art containing an abrasive grain (ceria grain) having a positive surface potential, and the line C represents a polishing property obtained in the CMP treatment which was performed using the abrasive agent of the prior art containing an abrasive grain (silica grain) having a positive surface potential.

It will be seen from FIG. 8 that according to the CMP treatment of this invention, the magnitude of dishing (D) can be minimized, and at the same time, the step (S) to be generated between the low-density wiring region and the high-density wiring region can be remarkably reduced as compared with the methods of the prior art, thereby making it possible to ensure a sufficient flatness of the film.

Next, the stability of polishing that can be realized by the CMP treatment of this invention will be explained with reference to FIG. 9.

Figure 9:
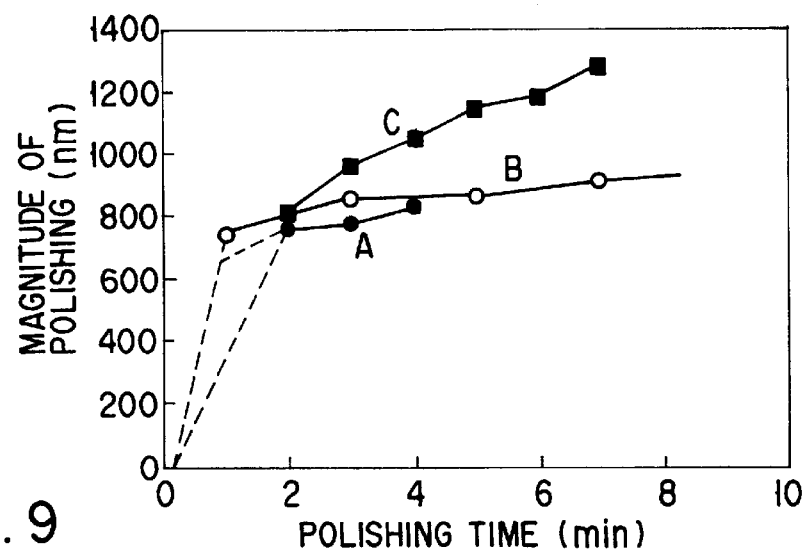
FIG. 9 is a graph for explaining a difference in effect between an abrasive agent to be employed in the method of this invention and an abrasive agent using an abrasive grain of the prior art.

FIG. 9 is a graph for explaining a difference in effect to be derived between an abrasive agent to be employed in the method of this invention and an abrasive agent using an abrasive grain of the prior art. The ordinate in FIG. 9 represents the magnitude of polishing (the quantity removed) (R) (nm) of the insulating film 53 shown in FIG. 6 which was formed on the wiring pattern 52b of the low-density wiring region (II), while the abscissa represents the polishing time (min.).

The line A in FIG. 9 represents a polishing property obtained in the CMP treatment which was performed using the abrasive agent of this invention, the line B represents a polishing property obtained in the CMP treatment which was performed using the abrasive agent of the prior art containing an abrasive grain (ceria grain) having a positive surface potential, and the line C represents a polishing property obtained in the CMP treatment which was performed using the abrasive agent of the prior art containing an abrasive grain (silica grain) having a positive surface potential.

It will be seen from FIG. 9 that according to the methods of the prior art, the polishing was continued even after a predetermined polishing thereby inviting an over-polishing and at the same time, prolonging the polishing time, whereas according to the CMP treatment of this invention, the polishing time can be shortened, and at the same time, the polishing could be prevented from further proceeding after finishing a predetermined polishing, thereby making it possible to obviate the over-polishing and to ensure a sufficient flatness of the film.

Next, the influence of the abrasive cloth explained with reference to FIG. 10 on a semiconductor substrate will be explained with reference to FIG. 10.

Figure 10:
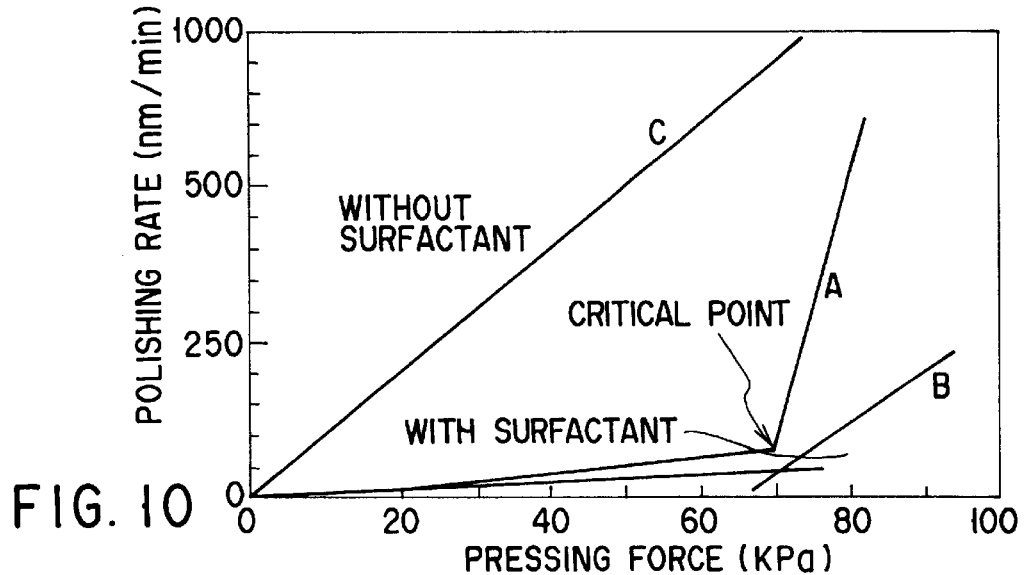
FIG. 10 is a graph for explaining a relationship between the pressing force of an abrasive cloth to a semiconductor substrate and the polishing rate.

FIG. 10 is a graph for explaining a relationship between the pressing force of an abrasive cloth to a semiconductor substrate and the polishing rate. The ordinate in FIG. 10 represents the polishing rate (nm/min.), while the abscissa represents the pressing force (kPa).

The line A in FIG. 10 represents a polishing property obtained in the CMP treatment which was performed using the abrasive agent of this invention, the line B represents a polishing property obtained in the CMP treatment which was performed using the abrasive agent of the prior art containing an abrasive grain (ceria grain) having a positive surface potential and a surfactant, and the line C represents a polishing property obtained in the CMP treatment which was performed using the abrasive agent of the prior art containing an abrasive grain (silica grain) having a positive surface potential but not containing a surfactant.

It will be seen from FIG. 10 that according to the conventional CMP treatment where a surfactant was not added to the abrasive agent, the pressing force of the abrasive cloth 25 was directly influenced on the abrasive grain 43, so that the polishing rate changed proportionally to the magnitude of pressing force as indicated by the line C. Whereas when a surfactant was added to the abrasive agent, the polishing work of the abrasive grain is suppressed to lower the polishing rate. However, the pressing force of the abrasive cloth was once exceeded over a given critical point, the surfactant was eliminated, thereby allowing the abrasive grain to be directly contacted with the semiconductor substrate (the line B).

In the case of the abrasive agent of this invention, since the abrasive grain is bonded with the surfactant through a physical adsorption, the adsorption as well as the desorption thereof are very sensitive, so that as shown in the line A, the polishing performance after the elimination of the surfactant from the abrasive grain, i.e. after the critical point, can be enhanced. Since the polishing according to this invention proceed as shown by the line A, the polishing performance thereof can be remarkably stabilized and an excellent flattening can be achieved.

As explained above, according to this invention, a water soluble polymer surfactant is incorporated into an abrasive solution for the purpose of obtaining an excellent flattening performance. However, this invention is particularly featured in that an abrasive grain charged negatively is employed as an abrasive agent, and that an anionic surfactant is incorporated into the solution of abrasive agent. As a result, the adsorption of the surfactant to the abrasive grain becomes a weak physical adsorption (a hydrogen bond), thereby enabling the surfactant to be easily desorbed from the abrasive grain on the occasion of polishing, so that the function of the abrasive grain can be sufficiently ensured thereby making it possible to achieve a higher polishing speed as compared with the conventional polishing, and at the same time, an excellent flattening performance can be achieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A CMP method for polishing and flattening a treating film having a rugged surface and formed on a surface of a semiconductor substrate by making use of an abrasive cloth while feeding an abrasive agent to the treating film, wherein said abrasive agent comprises abrasive grains having a surface potential adjusted to negative, and a surfactant formed of water soluble polymer, and the content of said surfactant is present in sufficient amounts to allow for suppressing a polishing rate in a first pressing force of the abrasive cloth and for abruptly increasing a polishing rate in a second pressing force of the abrasive cloth exceeding over a critical point and is 0.5% to 1.5% by weight based on the weight of said abrasive agent.

2. The CMP method according to claim 1, wherein said surfactant is added to said abrasive agent while said abrasive agent is fed to said abrasive cloth.

3. The CMP method according to claim 1, wherein said abrasive grain is at least one material selected from the group consisting of cerium oxide, silicon oxide, and silicon nitride.

4. The CMP method according to claim 1, wherein said abrasive grain is cerium oxide grain, and the pH of said abrasive agent to be fed to said treating film is not less than 7.

5. The CMP method according to claim 1, wherein said abrasive grain is silicon oxide grain, and the pH of said abrasive agent to be fed to said treating film is not less than 5.

6. The CMP method according to claim 1, wherein said water soluble polymer is an anionic polymer.

7. The CMP method according to claim 6, wherein said anionic polymer is at least one material selected from the group consisting of ammonium polyacrylate and an organic amine salt.

8. The CMP method according to claim 1, wherein said water soluble polymer has a molecular weight ranging from 100 to 10,000.

9. The CMP method according to claim 1, wherein the pH of said abrasive agent is adjusted by adding an alkali to said abrasive agent.

10. A CMP method for polishing and flattening a treating film having a rugged surface and formed on a surface of a semiconductor substrate by making use of an abrasive cloth while feeding an abrasive agent to the treating film, wherein said abrasive agent comprises abrasive grains having a surface potential adjusted to negative, and a surfactant formed of water soluble polymer, and the content of said surfactant is present in sufficient amounts to allow for suppressing a polishing rate in a first pressing force of the abrasive cloth and for abruptly increasing a polishing rate in a second pressing force of the abrasive cloth exceeding over a critical point and is 10% to 5000% by weight based on the weight of said abrasive grains.

11. The CMP method according to claim 10, wherein said surfactant is added to said abrasive agent while said abrasive agent is fed to said abrasive cloth.

12. The CMP method according to claim 10, wherein said abrasive grain is at least one material selected from the group consisting of cerium oxide, silicon oxide, and silicon nitride.

13. The CMP method according to claim 10, wherein said abrasive grain is cerium oxide grain and the pH of said abrasive agent to be fed to said treating film is not less than 7.

14. The CMP method according to claim 10, wherein said abrasive grain is silicon oxide grain and the pH of said abrasive agent to be fed to said treating film is not less than 5.

15. The CMP method according to claim 10, wherein said water soluble polymer is an anionic polymer.

16. The CMP method according to claim 15, wherein said anionic polymer is at least one material selected from the group consisting of ammonium polyacrylate and an organic amine salt.

17. The CMP method according to claim 10, wherein said water soluble polymer has a molecular weight ranging from 100 to 10,000.

18. The CMP method according to claim 10, wherein the pH of said abrasive agent is adjusted by adding an alkali to said abrasive agent.

19. The CMP method according to claim 10, wherein said water soluble polymer has a carboxyl group or sulfo group.

20. A CMP method for polishing and flattening a film having a rugged surface and formed on a surface of a semiconductor substrate by making use of an abrasive cloth while feeding an abrasive agent to the film, wherein said film comprises a first insulating layer formed on the semiconductor substrate, a metallic wiring pattern formed on the first insulating layer, and a second insulating layer formed on the first insulating and metallic wiring pattern, said abrasive agent comprises abrasive grains having a surface potential adjusted to negative, and a surfactant formed of a water soluble polymer, and the content of said surfactant is present in sufficient amounts to allow for suppressing a polishing rate in a first pressing force of the abrasive cloth and for abruptly increasing a polishing rate in a second pressing force of the abrasive cloth exceeding a critical point and is 0.5 to 1.5% by weight based on the weight of said abrasive agent.

21. The CMP method according to claim 20, wherein said first and second insulating layers are formed of silicon oxide, and said metallic wiring pattern is formed of aluminum.

* * * * *

UNITED STATES PATENT AND TRADEMARK OFFICE
CERTIFICATE OF CORRECTION

PATENT NO.     : 6,561,876 B1
DATED          : May 13, 2003
INVENTOR(S)    : Tateyama et al.

It is certified that error appears in the above-identified patent and that said Letters Patent is hereby corrected as shown below:

Column 14,
Line 1, change "insulating and" to -- insulating layer and --.

Signed and Sealed this

Twenty-fifth Day of November, 2003

JAMES E. ROGAN
*Director of the United States Patent and Trademark Office*